(12) United States Patent
Zhong et al.

(10) Patent No.: US 9,153,530 B2
(45) Date of Patent: Oct. 6, 2015

(54) THERMAL ENHANCED HIGH DENSITY FLIP CHIP PACKAGE

(75) Inventors: Chonghua Zhong, Irvine, CA (US); Kunzhong Hu, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 273 days.

(21) Appl. No.: 13/162,064

(22) Filed: Jun. 16, 2011

(65) Prior Publication Data

US 2012/0319255 A1    Dec. 20, 2012

(51) Int. Cl.
  *H01L 23/12*     (2006.01)
  *H01L 23/498*    (2006.01)
  *H01L 21/48*     (2006.01)

(52) U.S. Cl.
  CPC ...... *H01L 23/49827* (2013.01); *H01L 21/4846* (2013.01); *H01L 23/49816* (2013.01); *H01L 2224/16225* (2013.01); *H01L 2224/16227* (2013.01); *H01L 2224/16245* (2013.01); *H01L 2924/15311* (2013.01)

(58) Field of Classification Search
  CPC ............ H01L 23/49827; H01L 21/4846; H01L 23/49816; H01L 2224/16227; H01L 2224/16245; H01L 2924/15311; H01L 2224/16225; H01L 2224/023; H01L 2224/0233; H01L 2224/02331; H01L 2224/0237

USPC ........ 257/678, 684, 685, 686, 700, 734, 737, 257/738, 758, 773, E23.001, E25.006, 257/E23.021
  See application file for complete search history.

(56) References Cited

U.S. PATENT DOCUMENTS

| | | | | |
|---|---|---|---|---|
| 5,990,546 | A * | 11/1999 | Igarashi et al. | 257/700 |
| 6,277,669 | B1 * | 8/2001 | Kung et al. | 438/106 |
| 7,351,916 | B2 * | 4/2008 | Hsu | 174/260 |
| 2004/0113250 | A1 * | 6/2004 | Khandros et al. | 257/680 |
| 2004/0232543 | A1 * | 11/2004 | Goller et al. | 257/700 |
| 2009/0039508 | A1 * | 2/2009 | Kaufmann | 257/738 |
| 2011/0095415 | A1 * | 4/2011 | Topacio et al. | 257/692 |

* cited by examiner

*Primary Examiner* — Galina Yushina
(74) *Attorney, Agent, or Firm* — Sterne, Kessler, Goldstein & Fox PLLC

(57) ABSTRACT

Systems and methods according to embodiments of the invention enable flip chip packaging using high density routing while minimizing the thickness and layer count of the flip chip package. By using a photoresist layer to create very fine traces on a metallic base layer, embodiments of the present invention combine advantages of leadframe substrates and laminate substrates by supporting high-density routing while minimizing layer count and manufacturing cost. Additionally, the use of raised metallic pads in a routing layer enables embodiments of the present invention to include highly compact traces that pass over IC die bond pad connection sites without directly coupling to these bond IC die bond pad connection sites. Further, embodiments of the present invention can support multiple thin routing layers without the need for organic (e.g., laminate) material separating these routing layers.

20 Claims, 9 Drawing Sheets

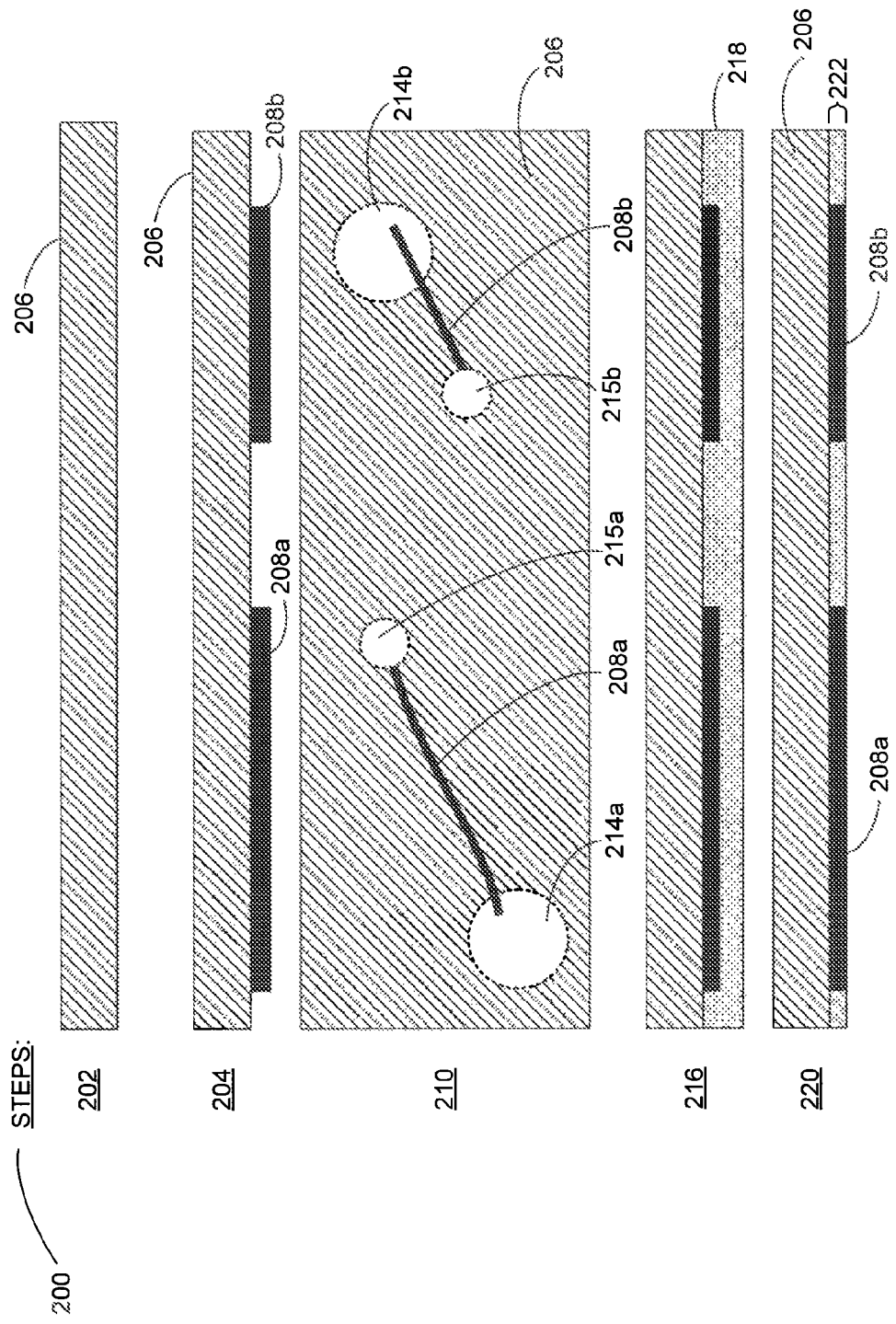

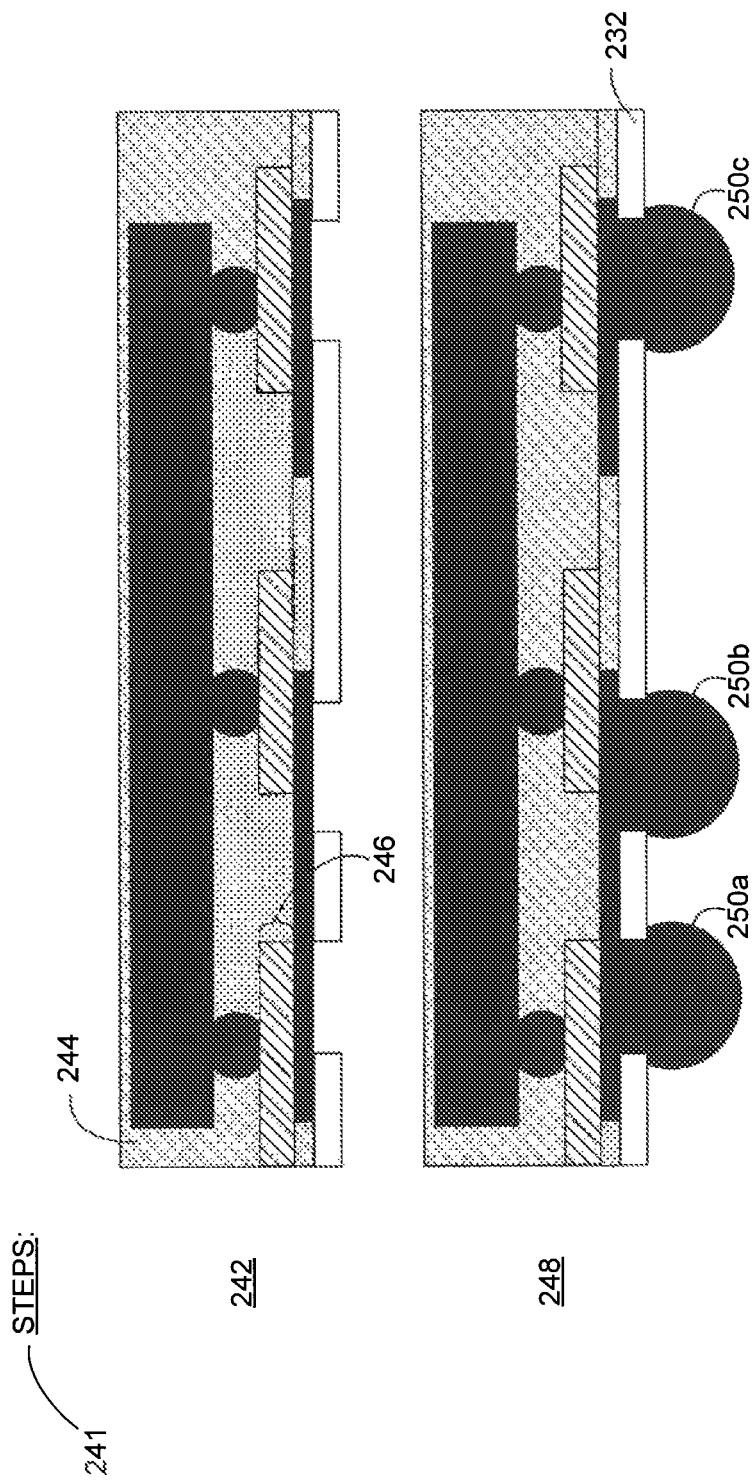

THERMAL ENHANCED HIGH DENSITY FLIP CHIP PACKAGE

FIELD OF THE INVENTION

This invention relates to integrated circuit (IC) device packaging and specifically to flip chip package configurations.

BACKGROUND OF THE INVENTION

Integrated circuit (IC) devices typically usually an IC die and a package that houses the IC die. The package protects the IC die (for example, during handling of the IC device) and can facilitate connections to other devices.

An IC die is typically mounted in or on a package that is attached to a printed circuit board (PCB) or a printed wire board (PWB). One such type of IC die package is a flip chip package ("flip chip"), also known as Flipchip Chip Scale Package (FCCSP). Flip chip is a technology in which electrically conductive elements, such as solder bumps, connect the IC die or the IC die package to a substrate, a PCB, or a PWB.

One type of conventional flip chip package is a flat no-leads package, which uses surface mounting to connect ICs to the surfaces of PCBs without the use of through-holes. Flat no-leads packages include Quad Flat No-Leads (QFN) packages and Dual Flat No-Leads (DFN) packages.

Conventional flip chip packages have a number of drawbacks. For example, the substrate in a conventional flip chip can increase the thickness of the IC device, and the length of the traces in the substrate can lead to interference from induced voltages. Further, as routing requirements increase, it becomes more difficult to achieve a high-density routing in a cost-effective manner.

In conventional flip chips, etching routing traces on a leadframe substrate can be a relatively inexpensive routing technique. However, leadframe substrates provide only one layer for routing and thus do not support highly complex routing. Laminate substrates provide multiple layers for routing. However, laminate substrates are more costly than leadframe substrates and require a long cycle time. Laminate substrates also have additional drawbacks, such as increasing warpage in the package, and poor thermal performance.

What is needed is a flip chip package and method of making the same that addresses one or more of the aforementioned shortcomings of conventional flip chip packages and methods.

BRIEF DESCRIPTION OF THE DRAWINGS/FIGURES

The accompanying drawings, which are incorporated in and constitute part of the specification, illustrate embodiments of the invention and, together with the general description given above and the detailed descriptions of embodiments given below, serve to explain the principles of the present invention. Features illustrated in the drawings are not necessarily drawn to scale. In the drawings:

FIG. 2A shows a block diagram illustrating a procedure for manufacturing a high density routing layer for a flip chip in accordance with an embodiment of the present invention.

FIG. 2C shows a block diagram illustrating a procedure for finalizing an IC package in accordance with an embodiment of the present invention.

Figure 1:
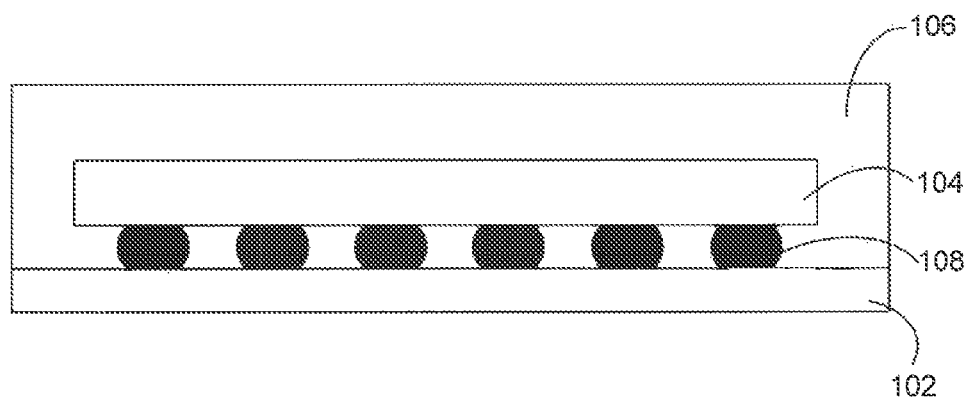
FIG. 1 is a block diagram of a flip chip mounted on a substrate.

Features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the Leftmost digit(s) in the corresponding reference number.

DETAILED DESCRIPTION OF THE INVENTION

Systems and methods according to embodiments of the invention enable flip chip packaging using high density routing while minimizing the thickness and layer count of the flip chip package. By using a photoresist layer to create very fine traces on a metallic base layer, embodiments of the present invention combine advantages of leadframe substrates and laminate substrates by supporting high-density routing while improving thermal performance, minimizing layer count and manufacturing cost. Additionally, the use of raised metallic pads in a routing layer enables embodiments of the present invention to include highly compact traces that pass over IC die bond pad connection sites without directly coupling to these IC die bond pad connection sites. Further, embodiments of the present invention can support multiple thin routing layers.

1. Overview

FIG. 1 is a block diagram 100 of a flip chip 104 mounted on a substrate 102. Solder bumps 108 are formed on the bond pads of the IC die 104. The IC die 104 is flipped over, so that the solder bumps 108 are aligned with corresponding connection sites on a substrate 102, which may be leadframe substrate (e.g., a copper-based metal layer) or laminate substrate (e.g., multiple copper layers laminated together). The substrate 102 routes bond pads on the IC die 104 to an array of connection elements coupled to the substrate (for example, solder balls in a ball grid array device).

A flip chip IC die 104 has pads on the active surface of the die, rather than the peripheral bond pads generally associated with a wirebond IC die. The pads on the active face of the flip chip IC die can connect to input/output (I/O), power, or ground. An encapsulate ("molding") 106 can be injected, painted, or molded around the flip chip IC die 104 to provide environmental protection for the flip chip IC die 104.

Routing between the IC die bond pads and the substrate connection elements can be accomplished, for example, using metal traces. Depending on how complicated the routing is for a particular IC die, a large number traces may be required. Particular routing configurations may require that traces be unlinked (i.e., not overlapped). As the number of traces increases, it becomes more difficult to draw trace lines that do not overlap. One way to incorporate additional non-overlapping traces is to use additional substrate layers for routing.

Thus, one substrate layer or multiple substrate layers may be necessary to achieve the necessary routing required by a particular IC die. Leadframe substrates provide only one layer for routing. Further, when a leadframe substrate is used, traces are tied to the outside of the tie bar, and traces are collected together in one layer (e.g., "floating traces" are not possible). Additionally, because leadframe packages use etching, leadframe packages do not support fine pitches and result in a long cycle time. Laminate substrates allow several metal layers to be laminated together to facilitate complicated routing. However, laminate substrates are more costly than leadframe substrates. Additionally, laminate substrates also require a long cycle time (e.g., around 4 to 8 weeks).

Embodiments of the present invention combine advantages of leadframe substrates and laminate substrates by enabling high-density routing while minimizing layer count. Flip chip packages manufactured according to embodiments of the present invention use a photoresist technique to create very fine traces on a metallic base layer. In an embodiment, these traces are metallic traces formed using a different metal than the metal in the metallic base layer. The traces are molded over for protection, allowing the metallic base layer to be etched away without compromising the traces. This molded trace layer thus enables very high density routing within a single layer.

In an embodiment, portions of the metallic base layer corresponding to bump sites (i.e., bond pads) on the IC die are allowed to remain after the metallic base layer etching process to create metallic pads that couple to the IC die. Embodiments of the present invention thus provide two metallic "layers" without requiring an organic material (such as laminate) for layer separation.

Flip chip packages created according to embodiments of the present invention advantageously result in the same or greater routing density (e.g., 10-20 micrometers) as that achieved by laminate substrates (e.g., 25 micrometers) with a much thinner package. For example, a routing layer in accordance with embodiments of the present invention has a thickness of about 40 micrometers, while a routing layer achieved using a laminate substrate typically has a thickness of 200-300 micrometers.

2. Systems

A procedure for manufacturing a flip chip in accordance with an embodiment of the present invention will now be explained with references to FIGS. 2A-2D. FIGS. 2A-2D show two dimensional views of portions of a three-dimensional flip chip as the flip-chip is manufactured. It should be understood that, for clarity, all portions of the flip chip package are not shown in FIGS. 2A-2D, and FIGS. 2A-2D are not necessarily drawn to scale.

FIG. 2A shows a block diagram illustrating steps 200 for manufacturing a high density routing layer for a flip chip package in accordance with some embodiments of the present invention. Step 202 shows a metallic strip 206 used as a metallic base layer of the flip chip package. In an embodiment, the metallic base layer is a copper strip. However, it should be understood that a variety of metallic base layer materials can be used, such as gold and nickel. The metallic base layer can be very thin (for example, 10-15 micrometers).

Step 204 shows traces 208 that are plated up from metallic base layer 206. Traces 208 are composed of an electrically conductive layer that are plated on the metallic base layer, and are used for signal routing. In an embodiment, traces 208 are made of a metallic material (e.g., copper, nickel, gold, etc.). Traces 208 may be formed using the same metal as the metal in metallic base layer 206 or using a different metal than the metal in metallic base layer 206.

Traces 208 may be formed using a variety of methods. In an embodiment, a photoresist layer (not shown) is added to metallic base layer 206. The photoresist layer functions as a mask to show the trace pattern. Light can be applied to the photoresist layer to form the trace pattern on metallic base layer 206. Metallic plating is then formed on the trace pattern created by the photoresist layer to result in plated traces 208.

This photoresist technique has several advantages. For example, this technique enables very thin traces to be formed (e.g., traces 10 micrometers wide) with low inductance. Further, different current density requirements for a particular IC die may require varying trace pitches. Embodiments of the present invention advantageously enable these traces to be formed with a very fine pitch (i.e., each trace and portion of a trace can be formed with a varying degree of height). For example, traces formed according to this photoresist technique may have a range of 20 micrometers to 50 micrometers in pitch.

Step 210 shows a bottom view of plated traces 208 on metallic base layer 206. It should be understood that, for clarity, only two traces (208a and 208b) are shown in FIG. 2A, and that flip chips manufactured according to embodiments of the present invention can incorporate several more traces.

Traces 208 are used to route connections on an IC die to substrate connection elements. When the flip chip is connected to a circuit board (e.g., a PCB or PWB), these substrate connection elements are coupled to connections on the circuit board. Smaller circles 215 represent IC die bond pad sites, and larger circles 214 represent substrate connection element sites. For example, circle 215a can represent the location of a bond pad on an IC die that will connect to trace 208a when the IC die is placed on top of metallic base layer 206. Circle 214a can represent the location of a substrate connection element (e.g., a solder ball). Trace 208a thus serves to route information from the IC die through bond pad site 215a to substrate connection element site 214a, which can in turn route information to the circuit board when the flip chip is installed. Likewise, trace 208b can route information from IC die bond pad site 215b to substrate connection element site 214b, which can forward the information to the circuit board.

In step 216, an encapsulate (molding) layer 218 is added to increase the rigidity of traces 208 and to hold traces 208 in a strip format. Because the traces are held in place by molding layer 218, metallic base layer 206 is no longer necessary to keep the traces intact. Thus, this molding layer advantageously enables metallic base layer 206 to be etched away in a later step.

The bottom portion of this molding layer 218 is stripped away in step 220 so that the lower surface of traces 208 is exposed to enable traces 208 to metallically couple to the IC die bond pads. Thus, according to this procedure, a very thin routing layer 222 composed of metallic traces 208 and molding 218 is formed on metallic base layer 206, and metallic base layer 206 can be stripped away without compromising the integrity of routing layer 222.

Figure 2B:
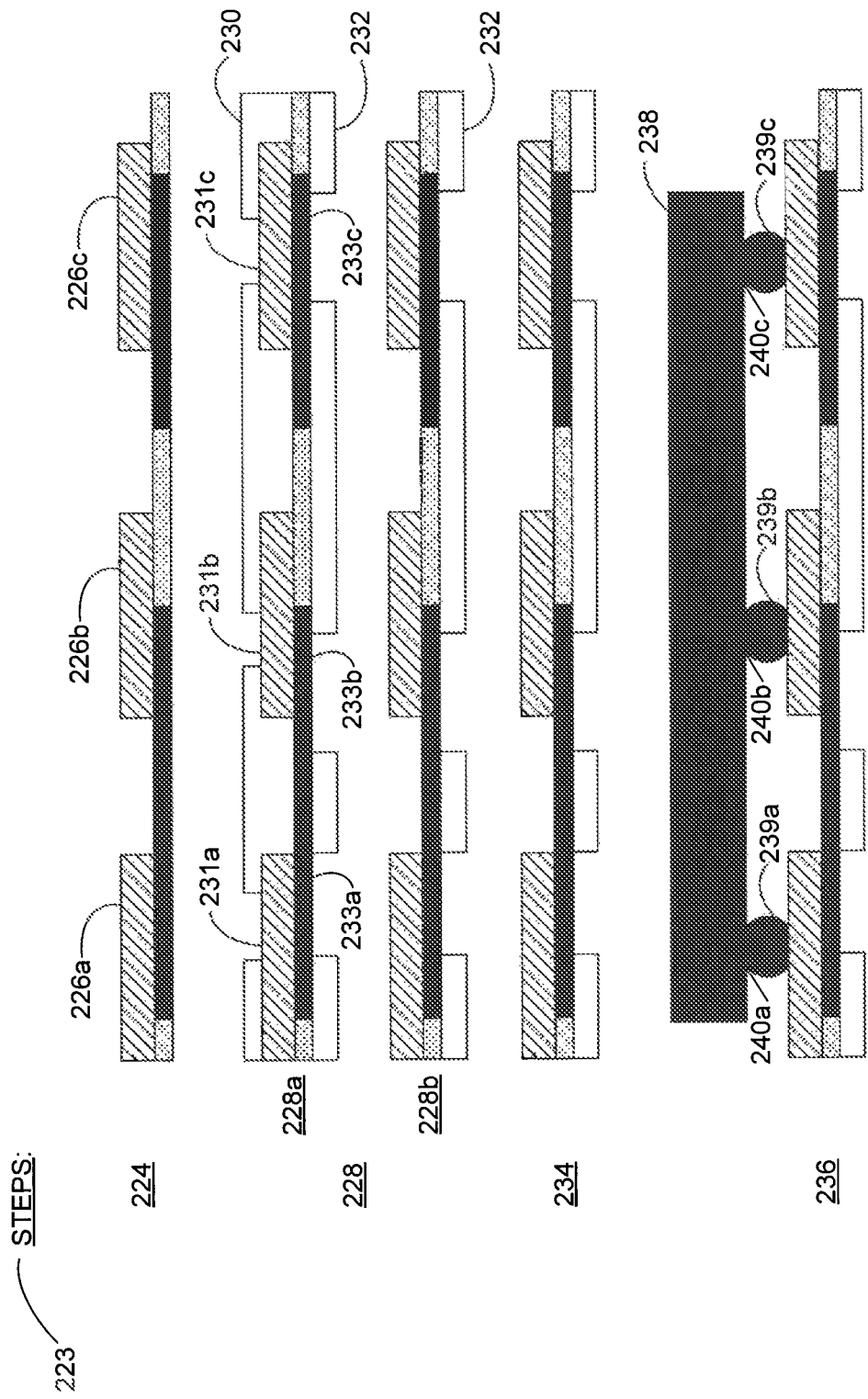
FIG. 2B shows a block diagram illustrating a procedure for creating coupling sites, on a routing layer, to an IC die and a circuit board in accordance with embodiments of the present invention.

FIG. 2B shows a block diagram illustrating steps 223 for creating coupling sites, on a routing layer, to the IC die and a circuit board in accordance with some embodiments of the present invention. Step 224 shows etching of metallic base layer 206 into metallic pads 226. These metallic pads can be used to couple to IC die bond pads or additional routing layer connection sites. In an embodiment, metallic pads 226 can be considered part of the routing layer.

In step 228, a solder mask is added. This step is optional. In one embodiment illustrated by sub-step 228a, a solder mask is added to the routing layer. In this embodiment, the top solder mask 230 is used to create smaller coupling sites 231 to IC die bond pads (or additional routing layer connection sites), and the bottom solder mask 232 is used to create coupling sites 233 to substrate element connection sites, such as solder balls (or additional routing layer connection sites). In another embodiment illustrated by sub-step 228b, a bottom solder mask 230 is only applied to the routing layer. In this embodiment, no smaller coupling sites 231 are created on the top portion of the routing layer.

In optional step 234, a surface treatment is added. In an embodiment, the surface treatment is a flash gold surface treatment. However, it should be understood that any surface treatment can be used (e.g., OSP, Nickel, Tin, etc.)

In step 236, the IC die 238 is attached to the routing layer. Step 236 shows bond pads 240 of the IC die being coupled to the metallic pads 226 of the routing layer. In an embodiment, bond pads 240 of the IC die may be coupled to metallic pads 226 using solder balls 239. However, it should be understood that solder balls 239 are optional, and, in embodiments of the present invention, bond pads 240 directly couple to metallic pads 226. While step 236 shows an embodiment according to sub-step 228b, it should be understood that bond pads 240 could couple to metallic pads 226 at locations determined by a solder mask. For example, if a top solder mask 230 was applied to the routing layer (as illustrated by sub-step 228a), bond pads 240 can couple to metallic pads 226 at smaller coupling sites 231 using solder balls, solder bumps, conductive epoxy, or other known techniques. The connection site between bond pads 240 and metallic pads 226 is represented by smaller circles 215 in FIG. 2A. However, it should be understood that the locations of these bond pad connection sites in FIGS. 2A and 2B do not necessarily correspond.

FIG. 2C shows a block diagram illustrating steps 241 for finalizing an IC package in accordance with some embodiments of the present invention. In step 242, a molding compound 244 is added to mold over and protect the IC die after the IC die has been attached to the routing layer. This molding compound 244 may be formed from the same material as the molding compound 218 used in the routing layer, or it may be formed from a different material. Additionally, the molding compound 244 fills in the vertical space 246 between the traces in the routing layer and the top of the metallic pads. The molding compound even fills the entire space between the top of the traces 208 and the bottom of the IC die 238.

Finally, in step 248, substrate connection elements 250 are added. In an embodiment, these substrate connection elements are solder balls. The coupling locations for substrate connection elements 250 can be determined, for example, based on solder mask 232 applied to the bottom portions of the routing layer. Substrate connection elements 250 may be used to couple the flip chip package to a circuit board when flip chip is installed. The connection site between substrate connection elements 250 and traces 208 is represented by larger circles 214 in FIG. 2A. However, it should be understood that the locations of these substrate connection element sites in FIGS. 2A and 2C do not necessarily correspond.

Figure 2D:
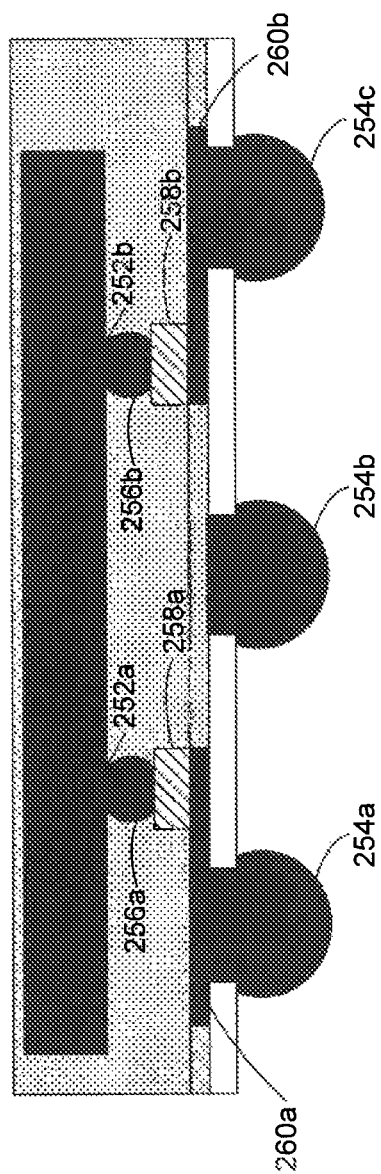
FIG. 2D shows a block diagram 251 illustrating routing in accordance with an embodiment of the present invention.

FIG. 2D shows a block diagram 251 illustrating routing in accordance with an embodiment of the present invention. Elements (e.g., metallic pads, traces, substrate connection elements, etc.) in FIG. 2D are made of the same material as similar elements in FIGS. 2A-2C. However, FIG. 2D shows a different positioning of these elements relative to each other than the illustrative positioning shown in FIGS. 2A-2C. In FIG. 2D, information from bond pads 252 is routed to and from substrate connection elements 254.

For example, information from IC die bond pad 252a is routed through solder ball or bumps 256a, which routes information to metallic pad 258a. Metallic pad 258a routes information through trace 260a, which routes the information to substrate connection element 254a, which can couple to a circuit board (not shown). Information from a circuit board can be routed through these same elements. For example, a circuit board can route information through substrate connection element 254c, through trace 260b, to metallic pad 258b. Metallic pad 258b then routes the information to solder ball or bumps 256b, which routes the information to IC die bond pad 252b. In FIG. 2D, substrate connection element 254b is not shown as connected to a bond pad. Further, in FIG. 2D, it is noted that IC bond pads 252 are not vertically aligned with solder balls 254, but are still coupled together by the flexible routing of traces 260.

It should be understood that while FIGS. 2A-2D show two dimensional drawings, embodiments of the present invention are implemented using three-dimensional elements, and the two-dimensional drawings of FIGS. 2A-2D) are shown for clarity to illustrate embodiments of the present invention. Further, it should be understood that embodiments of the present invention can incorporate several highly compact traces that are configured to route information from bond pads to substrate connection elements.

3. Advantages

The routing layer created according to embodiments of the present invention has several advantages. This molded trace layer enables very high density routing within a single layer. Flip chip packages created according to embodiments of the present invention advantageously result in the same or greater routing density (e.g., 10-20 micrometers) as that achieved by laminate substrates (e.g., 25 micrometers at best) with a much thinner package. For example, a routing layer in accordance with embodiments of the present invention has a thickness of about 40 micrometers, while a routing layer based on a laminate substrate typically has a thickness of 200-300 micrometers.

Figure 3:
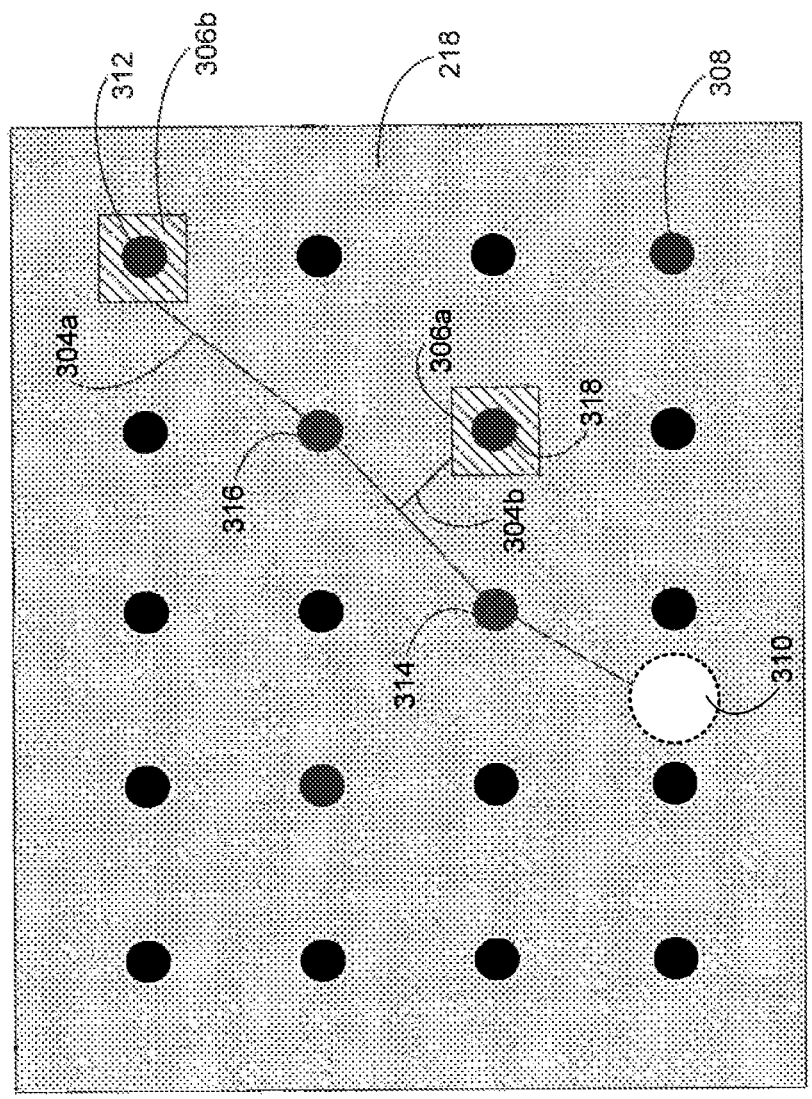
FIG. 3 shows a diagram illustrating advantages of embodiments of the present invention when portions of a metallic base layer are allowed to remain intact after other portions of the metallic base layer are etched away.

FIG. 3 shows a top-view diagram 300 illustrating advantages of embodiments of the present invention when portions 226 of metallic base layer 206 are allowed to remain intact after other portions of metallic base layer 206 are etched away. FIG. 3 shows a top view of a routing layer including molding 218, traces 304, and metallic pads 306. Traces 304 are metallic traces and can be formed by the same process as traces 208, but traces 304 are not necessarily positioned at the same location on the routing layer. Metallic pads 306 represent metallic pads 226 that remain intact after other portions of metallic base layer 206 have been etched away. Metallic pads 306 can be formed by the same process as metallic pads 226, but metallic pads 306 can be positioned at different locations on the routing layer than the positions of metallic pads 226 shown in FIG. 2B.

Black circles 308 represent bond pad sites of an IC die that will couple to the routing layer when the IC die is placed on top of the routing layer. Circle 310 represents the location of a substrate connection element (e.g., a solder ball). Bond pad sites 308 correspond to smaller circles 215 in FIG. 2A, and substrate connection element site 310 corresponds to larger circles 214 in FIG. 2A. However, it should be understood that the locations of bond pad sites 308 and substrate connection element site 310 on the routing layer do not necessarily correspond to the positions shown in FIG. 2A.

As shown in FIG. 3, trace 304a can be used to route information from bond pad 312 of the IC die to substrate connection element site 310. Although trace 304a is shown as "passing over" the location of bond pads 314 and 316, trace 304a does not couple to bond pads 314 and 316 because metallic pads 306 create raised platforms that leaves a vertical space 246 between trace 304a and bond pad sites 308. This vertical space 246 is filled in with molding, as shown in greater detail in FIG. 2C. Metallic pad 306b, however, does directly couple to bond pad 312. Additionally, trace 304b connects to trace 304a. Trace 304b thus enables routing from bond pad 318 of the IC die, through metallic pad 306a, to substrate connection element 310.

Thus, these residual metallic pads 306a and 306b that remain after the etching process enable the routing layer to support multiple trace connections in a single layer while avoiding unwanted connections to IC die bond pads 314 and 316 along the path of the trace. Because traces do not have to be drawn around IC die bond pad connection sites to avoid these unwanted connections, more traces can be drawn to fit within the surface area of the routing layer. Embodiments of the present invention provide advantages over flip chip packages incorporating base metal routing (e.g., flip chips using a leadframe substrate) and flip chips incorporating laminate substrates by providing two metallic "layers" without requiring an organic material (such as laminate) for layer separation. Embodiments of the present invention thus provide a high-density, "dual-layer" routing solution that is cost-effective and easy to manufacture using currently available engineering technologies.

Metallic pads 306a and 306b can also act as a heat sink, further increasing the thermal capabilities of the flip chip package. Additionally, as previously discussed, the vertical space 246 between traces 304 and the top of metallic pads 306 is filled in with a molding compound. This molding compound may the same molding compound as the compound used to protect the traces in molding layer 218 or a different molding compound. Because the Coefficient of Thermal Expansion (CTE) between the molding and the metallic pads 306 will differ, the resulting package will have low coplanarity concerns when heated.

Additionally, the elimination of the need to use a laminate substrate to provide multiple routing layers results in a flip chip package with a low strip warpage. Thus, embodiments of the present invention advantageously provide more reliable performance than flip chip packages using leadframe or laminate substrates.

It should further be understood that while a routing layer formed with two metallic sub-layers (i.e., the routing trace layer and the layer of metallic pads) have been described above, multiple layers of routing can be incorporated using techniques according to embodiments of the present invention. After the vertical space 246 between traces 304 and the top of metallic pads 306 is filled in with molding, additional routing layers may be added.

Figure 4:
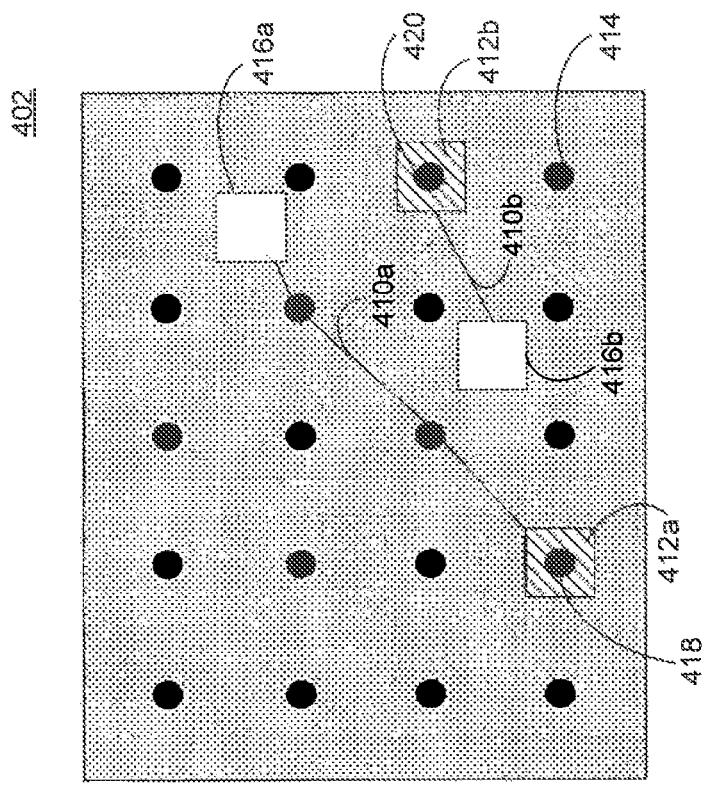
FIG. 4 shows two diagrams illustrating advantages of embodiments of the present invention incorporating multiple routing layers.
Figure 4:
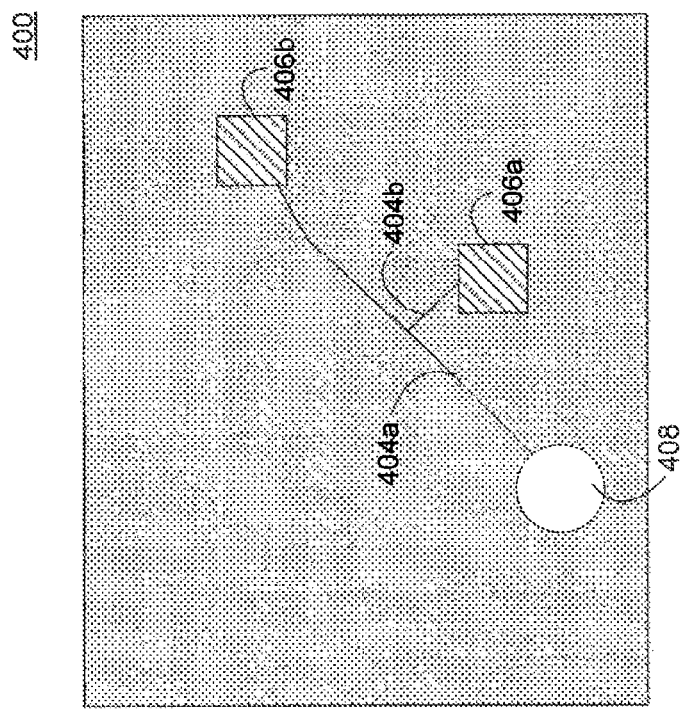

FIG. 4 shows two top-view diagrams illustrating advantages of embodiments of the present invention incorporating multiple routing layers. In FIG. 4, layer 402 is positioned directly on top of layer 400. Layer 400 includes traces 404 and raised metallic pads 406. Trace 404a routes information from substrate connection element site 408 to metallic pads 406, which couple to trace connection sites 416 in layer 402. Black dots 414 in layer 402 represent bond pad sites of an IC die positioned on top of layer 402. Trace 410a routes information from trace connection site 416a to bond pad site 418 located in raised metallic pad 412a. Trace 410b routes information from trace connection site 416b to bond pad site 420 located in metallic pad 412b. Thus, traces 404 and 410 support routing of information from substrate element connection site 408 to bond pad sites 418 and 420 over multiple routing layers without requiring a laminate substrate. It should be understood that although two routing layers are described in FIG. 4, any number of routing layers may be formed and connected according to this procedure. Further, these multiple routing layers may be directly coupled to each other without the need for an organic (e.g., laminate) material separating them.

4. Methods

Figure 5:
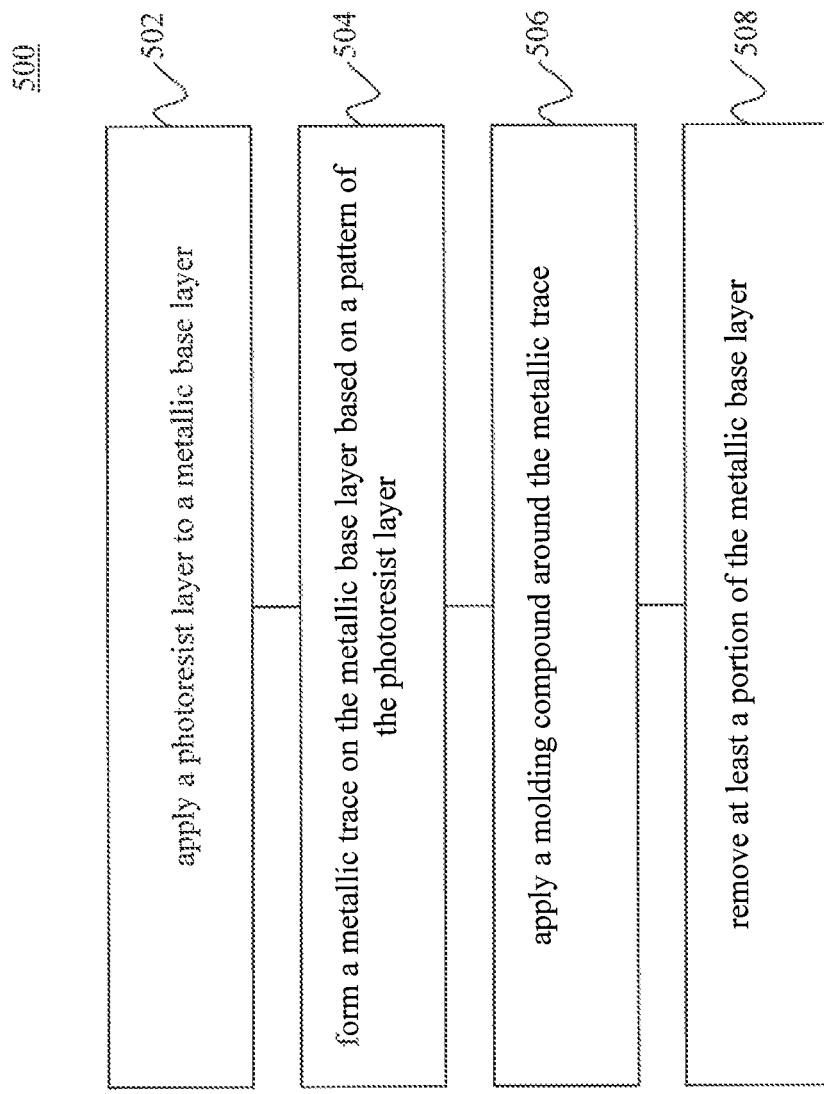
FIG. 5 is a flowchart showing a method of manufacturing a routing layer for an IC device in accordance with embodiments of the present invention.
Figure 6:
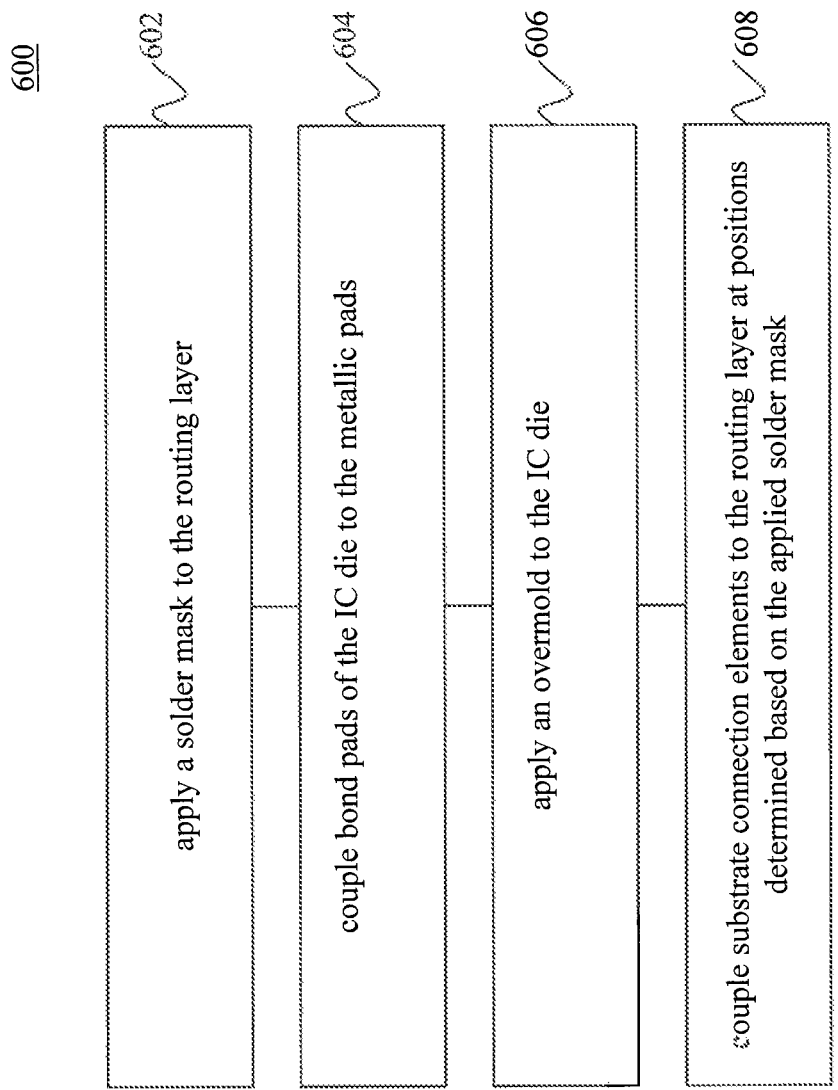
FIG. 6 is a flowchart showing a method of coupling a routing layer to an IC die and substrate connection elements in accordance with embodiments of the present invention.

A method of manufacturing a routing layer for an IC device in accordance with embodiments of the present invention will now be explained with reference to a flowchart 500 shown in FIG. 5. In step 502, a photoresist layer is applied to a metallic base layer (e.g., a copper strip). The photoresist layer functions as a mask to show a trace pattern.

In step 504, a metallic trace on the metallic base layer is formed using the trace pattern. For example, light is applied to the photoresist layer to form the trace pattern on the metallic base layer. Metallic plating is then formed on the trace pattern created by the photoresist layer to result in plated traces. This photoresist technique enables very thin traces to be formed (e.g., traces 10 micrometers wide) with low inductance.

In step 506, a molding compound is applied around the metallic trace. This molding compound protects the metallic trace. Because the molding compound holds the metallic trace in place, the metallic base layer can be safely removed without compromising the metallic trace. In an embodiment, an excess portion of the molding compound is removed so that the metallic trace is exposed.

In step 508, at least a portion of the metallic base layer is removed. In an embodiment, the entire metallic base layer is removed. In another embodiment, the metallic base layer is etched to form metallic pads corresponding to connection sites of bond pads on an IC die or connection sites of traces in another layer. Once the metallic base layer has been etched, the resulting combination of the metallic trace, molding compound, and (optionally) metallic pads can serve as a routing layer. In an embodiment, a vertical space between the metallic trace and the metallic pads is filled in with a molding compound.

A method of coupling a routing layer to an IC die and substrate connection elements in accordance with embodiments of the present invention will now be explained with reference to a flowchart 600 shown in FIG. 8. In step 602, a solder mask is applied to the routing layer. In an embodiment, this solder mask is applied only on the bottom of the routing layer to form couplings for substrate connection elements. In another embodiment, the solder mask is applied to both the top and the bottom of the routing layer. If the solder mask is applied to the top of the routing layer, it forms smaller couplings for the metallic pads and bond pads of the IC die. A surface treatment may optionally be added at this point.

In step 604, bond pads of the IC die are coupled to the metallic pads to form a connection. In step 606, an overmold is applied to the IC die. Finally, in step 608, substrate connection elements (e.g., solder balls) are coupled to the routing layer at positions determined based on the applied solder mask. After the substrate connection elements are applied, the resulting flip chip package can be installed onto a circuit board. The flip chip package routes information from the circuit board, through the routing layer, to the bond pads of the IC die.

5. Conclusion

The above systems and methods may be implemented as a computer program executing on a machine, as a computer program product, or as a tangible and/or non-transitory computer-readable medium having stored instructions.

For example, the functions described herein could be embodied by computer program instructions that are executed by a computer processor or any one of the hardware devices listed above. The computer program instructions cause the processor to perform the signal processing functions described herein. The computer program instructions (e.g. software) can be stored in a tangible non-transitory computer usable medium, computer program medium, or any storage medium that can be accessed by a computer or processor. Such media include a memory device such as a RAM or ROM, or other type of computer storage medium such as a computer disk or CD ROM. Accordingly, any tangible non-transitory computer storage medium having computer program code that cause a processor to perform the signal processing functions described herein are within the scope and spirit of the present invention.

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. An integrated circuit (IC) device comprising:
    an IC die;
    a routing layer coupled to a surface of the IC die, wherein the routing layer includes:
        a plurality of metallic traces including a first metallic trace, and
        a molding portion surrounding the plurality of metallic traces, wherein a thickness of the first metallic trace is substantially equal to a thickness of the molding portion, wherein a side portion of the molding portion is coupled to a side portion of the first metallic trace, wherein an entire area of a top surface of the first metallic trace is coplanar with a top surface of the molding portion, and wherein an entire area of a bottom surface of the first metallic trace is coplanar with a bottom surface of the molding portion; and
    a plurality of substrate connection elements coupled to the routing layer.

2. The IC device of claim 1, wherein the IC die includes a plurality of bond pads, and wherein the IC device further comprises:
    a plurality of metallic pads, wherein a first metallic pad in the plurality of metallic pads is coupled to a first bond pad in the plurality of bond pads.

3. The IC device of claim 1, further comprising:
    a second routing layer positioned between the routing layer and the substrate connection elements, wherein the second routing layer includes a second metallic trace; and
    a plurality of metallic pads, wherein a first metallic pad in the plurality of metallic pads is coupled to the first metallic trace and the second metallic trace.

4. The IC device of claim 2, wherein the first metallic trace is coupled to the first bond pad and a first substrate connection element in the plurality of substrate connection elements.

5. The IC device of claim 2, wherein the first metallic pad is coupled to the first bond pad and the first metallic trace.

6. The IC device of claim 2, wherein a portion of the first metallic trace is positioned below a second bond pad in the plurality of bond pads, and wherein the first metallic trace is configured to pass below the second bond pad without contacting the second bond pad.

7. An integrated circuit (IC) device comprising:
    an IC die including a plurality of bond pads;
    a plurality of substrate connection elements; and
    a routing layer positioned between the IC die and the substrate connection elements, wherein the routing layer includes:
        a first layer comprising a first plurality of metallic pads and a first molding portion, wherein a first metallic pad in the first plurality of metallic pads is coupled to a first bond pad in the plurality of bond pads, and
        a second layer comprising:
            a plurality of metallic traces, wherein a first metallic trace in the plurality of metallic traces is coupled to the first metallic pad, and
            a second molding portion, wherein a thickness of the first metallic trace is substantially equal to a thickness of the second molding portion, wherein a side portion of the second molding portion is coupled to a side portion of the first metallic trace, wherein an entire area of a top surface of the first metallic trace is coplanar with a top surface of the second molding portion, and wherein an entire area of a bottom surface of the first metallic trace is coplanar with a bottom surface of the second molding portion.

8. The IC device of claim 7, wherein the first molding portion and the second molding portion are formed from the same material.

9. The IC device of claim 7, wherein the first metallic trace is coupled to the first metallic pad and a first substrate connection element in the plurality of substrate connection elements.

10. The IC device of claim 7, wherein the routing layer further includes a vertical space between the plurality of metallic traces and the plurality of bond pads.

11. The IC device of claim 10, wherein the first molding portion is configured to fill in the vertical space.

12. A routing layer for an integrated circuit (IC) device, wherein the routing layer comprises:
    a first layer comprising a first plurality of metallic pads and a first molding portion,
    a second layer comprising a first plurality of metallic traces and a second molding portion, wherein a first metallic trace in the first plurality of metallic traces is coupled to a first metallic pad in the first plurality of metallic pads, and
    a third layer comprising:
        a second plurality of metallic traces, wherein a second metallic trace in the second plurality of metallic traces is directly coupled to the first metallic trace, and
        a third molding portion, wherein a thickness of the second metallic trace is substantially equal to a thickness of the third molding portion, wherein a side portion of the third molding portion is coupled to a side portion of the second metallic trace, wherein an entire area of a top surface of the second metallic trace is coplanar with a top surface of the third molding portion, and wherein an entire area of a bottom surface of the second metallic trace is coplanar with a bottom surface of the third molding portion.

13. The routing layer of claim 12, wherein the first metallic trace is configured to be coupled to a connection site of an IC die.

14. The routing layer of claim 12, further comprising:
a fourth layer comprising a second plurality of metallic pads, wherein the first metallic trace is coupled to the first metallic pad, and wherein the second metallic trace is coupled to a second metallic pad in the second plurality of metallic pads.

15. The routing layer of claim 12, wherein the second metallic trace is directly coupled, without using a via, to the first metallic trace.

16. The routing layer of claim 12, wherein the thickness of the first plurality of metallic traces and the second plurality of metallic traces is under fifty micrometers.

17. The routing layer of claim 12, wherein the second metallic trace is directly coupled to the first metallic trace without coupling to a die pad.

18. The routing layer of claim 12, wherein the routing layer is configured to be positioned between an IC die and a plurality of substrate connection elements.

19. The routing layer of claim 18, wherein the second metallic trace is configured to be coupled to a first substrate connection element in the plurality of substrate connection elements.

20. An integrated circuit (IC) device comprising:
an IC die including a plurality of bond pads;
a plurality of substrate connection elements; and
a routing layer positioned between the IC die and the substrate connection elements, wherein the routing layer includes first, second, and third layers, and wherein:
the first layer comprises a first plurality of metallic pads and a first molding portion, wherein a first metallic pad in the first plurality of metallic pads is coupled to a first bond pad in the plurality of bond pads, and
the second layer comprises a first metallic trace and a second molding portion, wherein the first metallic trace is coupled to the first metallic pad, wherein the second molding portion has first and second surfaces coplanar with first and second surfaces of the first metallic trace, wherein a side portion of the second molding portion is coupled to a side portion of the first metallic trace, wherein an entire area of a top surface of the first metallic trace is coplanar with a top surface of the second molding portion, and wherein an entire area of a bottom surface of the first metallic trace is coplanar with a bottom surface of the second molding portion.

* * * * *